United States Patent
Kanno

(10) Patent No.: US 8,471,526 B2
(45) Date of Patent: Jun. 25, 2013

(54) PROTECTION DEVICE FOR SECONDARY BATTERIES, AND BATTERY PACK AND ELECTRONIC EQUIPMENT EMPLOYING SAME

(75) Inventor: Junichi Kanno, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 598 days.

(21) Appl. No.: 12/725,778

(22) Filed: Mar. 17, 2010

(65) Prior Publication Data

US 2010/0239896 A1 Sep. 23, 2010

(30) Foreign Application Priority Data

Mar. 17, 2009 (JP) .................................. 2009-064319

(51) Int. Cl.
*H02J 3/36* (2006.01)
*H02J 7/00* (2006.01)

(52) U.S. Cl.
USPC ............................. 320/116; 320/117; 320/161

(58) Field of Classification Search
USPC .................................................. 320/116, 161
See application file for complete search history.

(56) References Cited

U.S. PATENT DOCUMENTS

| 7,965,061 B2 * | 6/2011 | Li et al. ......................... 320/152 |
| 2004/0036446 A1 * | 2/2004 | Iwashima ...................... 320/116 |
| 2005/0083015 A1 * | 4/2005 | Adachi .......................... 320/116 |
| 2005/0127873 A1 * | 6/2005 | Yamamoto et al. ........... 320/116 |
| 2007/0268000 A1 * | 11/2007 | Kobayashi et al. ........... 320/118 |
| 2009/0130542 A1 * | 5/2009 | Mizoguchi et al. ............. 429/61 |

FOREIGN PATENT DOCUMENTS

| JP | 2007-325434 | 12/2007 |
| JP | 2008-72800 | 3/2008 |
| JP | 2008-164567 | 7/2008 |

* cited by examiner

*Primary Examiner* — Yogendra Gupta
*Assistant Examiner* — Emmanuel S Luk
(74) *Attorney, Agent, or Firm* — Cooper & Dunham LLP

(57) ABSTRACT

A protection device includes a voltage detector having N or more sub-circuits each for monitoring a specific battery cell to output a detection signal when at least one of the battery cells outputs an abnormal voltage. Each sub-circuit includes voltage dividing resistors, a reference voltage generator, and a comparator. The voltage dividing resistors generate a voltage division signal by dividing an output voltage of the battery cell. The reference voltage generator generates a reference voltage. The comparator compares the voltage division signal against the reference voltage. Each comparator is powered with voltage across the battery cell associated with the sub-circuit.

12 Claims, 4 Drawing Sheets

PROTECTION DEVICE FOR SECONDARY BATTERIES, AND BATTERY PACK AND ELECTRONIC EQUIPMENT EMPLOYING SAME

TECHNICAL FIELD

The present disclosure relates to a protection device for secondary batteries and a battery pack and electronic equipment using the same, and more particularly, to a protection device that protects a set of secondary batteries connected in series to form a battery pack, and a battery pack and electronic equipment employing such a protection device.

BACKGROUND ART

Recently, small hand-held electronic devices, such as laptop computers, mobile phones, video cameras, digital cameras, portable receivers compatible with One-Seg broadcasting, portable music players, and the like, have become very popular.

Battery packs are employed in those portable electronics for their ease of handling. Typically, a battery pack is formed of one or more secondary batteries or cells assembled in a package, each cell consisting of a high-density battery such as a lithium-ion battery, a lithium polymer battery, and a nickel metal hydride battery. These high-density batteries contain extremely large amounts of energy, so that abnormal voltages in the power circuitry, such as overcharge, overdischarge, or excessive current, may cause the battery pack to generate heat or even to catch fire when overheated.

To avoid heating and ignition and prevent constituent secondary cells from deterioration over time, a battery pack is generally equipped with a charge and discharge protection circuit that protects the power circuitry from abnormal conditions, including overcharge, overdischarge, and overcurrent induced by overcharge and overdischarge, as well as short-circuits, overheating, etc., by shutting off a connection between a secondary battery and a battery charger or load device upon detecting an abnormal voltage across a battery cell.

For example, Japanese Patent Application Laid-Open Publication No. 2008-164567 discloses a battery cell voltage monitoring device, including a voltage sensor to monitor voltages across multiple battery cells, an output logic circuit to output a voltage detection signal indicating detection of abnormal voltage based on the output signal from the voltage sensor, and a delay circuit to provide the output signal with a predetermined delay and forward the delayed signal to the output logic circuit. In this monitoring device, the voltage sensor includes multiple comparators with hysteresis characteristics, each dedicated to one of the battery cells to provide a comparison output based on which the voltage sensor detects a voltage across each specific battery cell.

It is known that a comparator exhibits a varying input offset voltage for a given level of voltage supplied to its power terminal, depending an the level of voltage input to its input terminal for comparison with a reference voltage.

According to the arrangement mentioned above, the voltage sensor comparators are all powered with a voltage output from the series of battery cells as a whole constituting the battery pack, and receive different input voltages from the respective battery cells. Hence, these comparators exhibit different input offset voltages (e.g., a comparator monitoring a cell directly coupled to the supply terminal and a comparator monitoring a cell directly coupled to the ground terminal can have significantly different input offset voltages), and can detect different levels of abnormal voltages for a common reference voltage even where they are substantially identical in configuration. This affects precision of voltage detection in the conventional battery cell voltage monitoring device.

Another problem encountered by conventional battery packs is the difficulty in designing a protection circuit that can be used in various types of battery packs regardless of the number of secondary cells used in the battery pack.

As mentioned, a battery pack consists of a set of two or more battery cells connected in series. The number of such cells differs by the type of equipment in which the battery pack is installed, e.g., about 2 to 4 cells in the case of those used for small, hand-held devices. On the other hand, a protection circuit is provided as a semiconductor device integrated into an integrated circuit (IC), which has a specific number of voltage detectors or detection terminals each dedicated to a single battery cell in a multi-cell battery pack.

Thus, manufacturers of protection ICs are required to provide products with different numbers of detector elements for different battery packs depending on the number of secondary cells. However, producing a variety of products identical in operation for different types of battery packs is inefficient and costly.

To avoid such inefficiency, it is possible to use a protection circuit in a battery pack by short-circuiting terminals of detectors out of use in the protection circuit. This method will work where the number of secondary cells in the battery pack is less than the number of voltage detectors in the protection circuit (e.g., a protection circuit with four voltage detectors can be used with a battery pack containing 2 or 3 secondary cells). However, short-circuiting the unused detector terminals can result in malfunctioning of the protection circuit, where the voltage detector senses the short-circuit as an overdischarge to turn off a switch transistor connected between the battery and load circuitry.

Currently, there are several protection IC products commercially available that can be used with different numbers of battery cells. For example, one such battery protector, which is compatible with both four-cell and three-cell batteries, includes four voltage detection circuits for four battery cells. Each of the four detection circuits is provided with a comparator for detecting overdischarge of a specific one of the battery cells, as well as a selection terminal connected to an external signal source, which forces the output of a predetermined one of the four comparators to go inactive upon receiving a negation signal. Thus, supplying the negation signal makes the circuit for use in a three-cell battery, and not doing so holds it in the original state which is suitable for use in a four-cell battery.

However, such a method has limitations in that implementing the cell number selection capability in existing protection circuitry will require a lot of modification to the circuitry, involving changes in the configuration of the voltage detection comparator. Such modification can be further complicated when the protection circuit is configured to provide selection capability for a wide range of battery cell configurations.

BRIEF SUMMARY

This patent specification describes a novel protection device for use in a battery assembly containing a series of N secondary battery cells, "N" being a positive integer greater than one.

In one exemplary embodiment, the novel protection device includes a voltage detector having N or more sub-circuits each for monitoring a specific battery cell to output a detection signal when at least one of the battery cells outputs an abnormal voltage. Each sub-circuit includes voltage dividing resistors, a reference voltage generator, and a comparator. The voltage dividing resistors generate a voltage division signal by dividing an output voltage of the battery cell. The reference voltage generator generates a reference voltage. The comparator compares the voltage division signal against the reference voltage. Each comparator is powered with voltage across the battery cell associated with the sub-circuit.

This patent specification also describes a novel protection device for use in a battery assembly containing a series of N secondary battery cells, "N" being a positive integer greater than one In one exemplary embodiment, the protection device includes a voltage detector, a selection terminal, a load, N primary metal-oxide-semiconductor transistors, and (N−1) or less secondary metal-oxide-semiconductor transistors. The voltage detector outputs a detection signal when at least one of the battery cells outputs an abnormal voltage. The selection terminal outputs a selection signal specifying a number of battery cells connected to the protection device in the battery assembly. The load is connected between a power supply terminal and a ground terminal of the protection circuit. The N primary metal-oxide-semiconductor transistors are connected in series with the load between the power supply terminal and the ground terminal. Each primary transistor turns off in response to the detection signal output from the low voltage detector. The (N−1) or fewer secondary metal-oxide-semiconductor transistors each is connected in parallel with an associated one of the primary transistors and has a gate terminal connected to the selection terminal. Each secondary transistor deactivates and activates the associated primary transistor by turning on and off in response to the selection signal. The protection circuit outputs a voltage detection signal to another circuit at a node where the load connects to the series of primary transistors.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
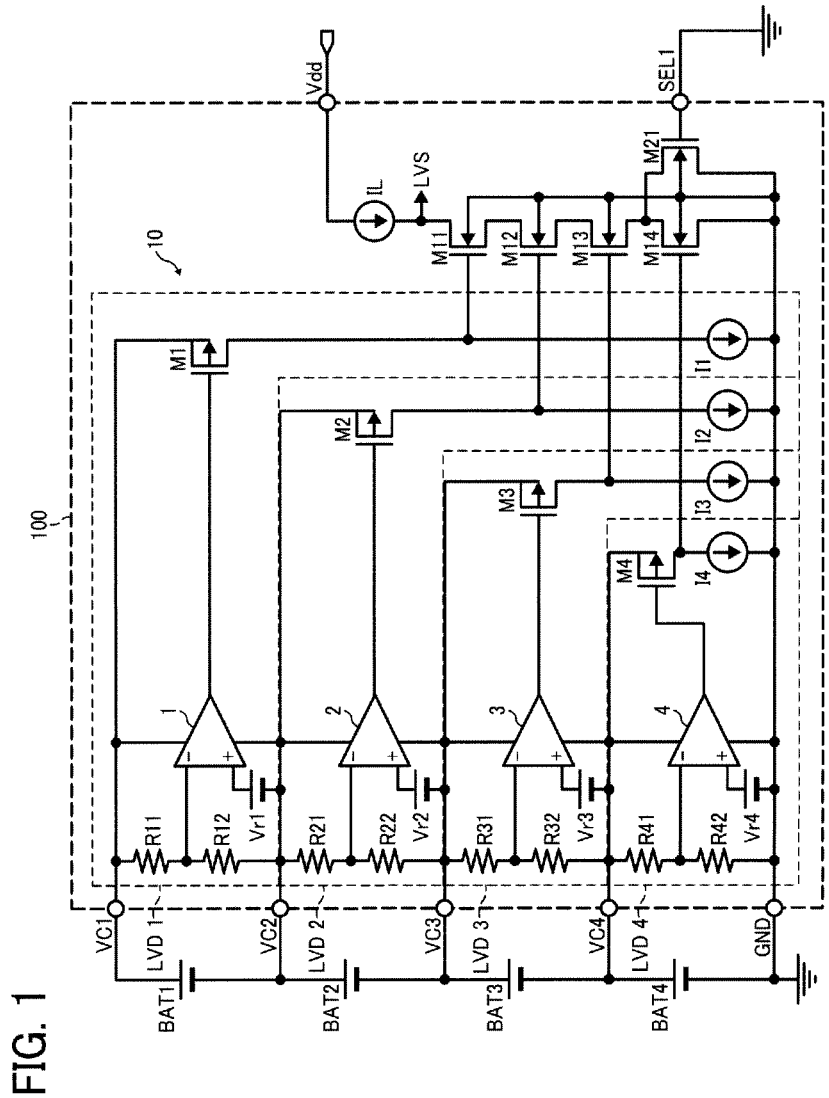
FIG. 1 is a circuit diagram illustrating a protection device, shown with a low voltage detector for protecting a battery assembly against low voltages according to one embodiment of this patent specification.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, exemplary embodiments of the present patent application are described.

FIG. 1 is a circuit diagram illustrating a protection device 10 for protecting a battery assembly or pack against low voltages according to one embodiment of this patent specification.

This embodiment represents an example in which the protection device 100 includes a low voltage detector 10 to detect a low voltage condition in the battery pack where at least one of the four cells BAT1 through BAT4 outputs a voltage lower than a given low threshold voltage. However, the number of battery cells included in the battery pack may be other than that depicted in the drawing, and the protection device 100 may also include a high voltage detector and an overcurrent detector, which are not depicted in the drawing.

As shown in FIG. 1, the protection device 100 includes battery terminals VC1 through VC4 for connection with the cells BAT1 through BAT4 of the secondary battery pack, a ground terminal GND, a power supply terminal Vdd, and a selection terminal SEL1 to specify a number of battery cells in use, in addition to the low voltage detector 10.

In the protection device 100, a positive electrode of the first cell BAT1 is connected to the battery terminal VC1, and a positive electrode of the second cell BAT2 and a negative electrode of the first battery cell BAT1 are connected together to the battery terminal VC2. A positive electrode of the third cell BAT3 and a negative electrode of the second cell BAT2 are connected together to the battery terminal VC3. A positive electrode of the fourth cell BAT4 and a negative electrode of the third cell BAT3 are connected together to the battery terminal VC4. A negative electrode of the fourth cell BAT4 is connected to the ground terminal GND. The selection terminal SEL1 is connected to the ground terminal GND. The power terminal Vdd is connected to a power supply, not shown, or to the battery terminal VC1.

The low voltage detector 10 includes comparators 1 through 4, reference voltage generators Vr1 through Vr4, a first pair of resistors R11 and R12, a second pair of resistors R21 and R22, a third pair of resistors R31 and R32, and a fourth pair of resistors R41 and R42, P-channel metal-oxide-semiconductor (PMOS) transistors M1 through M4, and constant current sources I1 through I4, as indicated by the area defined by broken lines in FIG. 1.

In the low voltage detector 10, the comparator 1, the resistors R11 and R12, the reference voltage generator Vr1, the PMOS transistor M1, and the current source I1 together form a first detection circuit or sub-circuit LVT1 to detect a low voltage of the first battery cell BAT1. Similarly, the comparator 2, the resistors R21 and R22, the reference voltage generator Vr2, the PMOS transistor M2, and the current source I2 together form a second detection circuit LVT2 for the second cell BAT2, the comparator 3, the resistors R31 and R32, the reference voltage generator Vr3, the PMOS transistor M3, and the current source I3 together form a third detection circuit LVD3 for the third cell BAT3, and the comparator 4, the resistors R41 and R42, the reference voltage generator Vr4, the PMOS transistor M4, and the current source I4 together form a fourth detection circuit LVD4 for the fourth cell BAT4.

In the first detection circuit LVD1, the resistors R11 and R12 are connected in series between the battery connection terminals VC1 and VC2. The resistors R11 and R12 form a connection node therebetween coupled to an inverting input of the comparator 1. The reference voltage generator Vr1 is connected between a non-inverting input terminal of the comparator 1 and the battery connection terminal VC2.

Power terminals of the comparator 1 are connected to the battery connection terminals VC1 and VC2, respectively. An output terminal of the comparator 1 is connected to a gate of the PMOS transistor M1. A source of the PMOS transistor M1 is connected to the battery connection terminal VC1. The current source I1 is connected between a drain of the PMOS transistor M1 and the ground terminal GND. The drain of the PMOS transistor M1 constitutes a first low voltage detection terminal at which the first detection circuit LVD1 outputs a detection signal to indicate when detecting a voltage across the first battery cell BAT1 falling below the lower threshold voltage.

The voltage detection circuits LVD1 through LVD4 contained in the low voltage detector 10 are substantially identical in configuration and operation, except for the battery cells to which the respective circuits are dedicated. Therefore, the configuration of the first detection circuit LVD1 described above suffices to explain the configuration of the other detection circuits LVD2 through LVD4, of which a further description is omitted for brevity.

The protection device 100 also includes first through fourth primary, N-channel metal-oxide-semiconductor (NMOS) transistors M11 through M14 connected in series, and a secondary NMOS transistor M21 connected in parallel with the fourth NMOS transistor M14. A current source or load IL is connected between the power supply terminal Vdd and one end of the series circuit of the NMOS transistors M11 through M14 (which, in this embodiment, is a drain of the first NMOS transistor M11). A source of the NMOS transistors M14 is connected to the ground terminal GND. A gate of the secondary NMOS transistor M21 is connected to the selection terminal SEL1.

A gate of the NMOS transistor M11 is connected to the drain of the PMOS transistor M1, which is the first low voltage detection terminal of the voltage detector 10. Similarly, a gate of the NMOS transistor M12 is connected to the drain of the PMOS transistor M2, a gate of the NMOS transistor M13 is connected to the drain of the PMOS transistor M3, and a gate of the NMOS transistor M14 is connected to the drain of the PMOS transistor M4.

A low voltage detection signal LVS is output from the connection between the first NMOS transistor M11 and the current source IL for input to an internal circuit, not shown.

During operation, the secondary NMOS transistor M21 remains off and is not involved in the voltage detection where the selection terminal SEL1 is connected to the ground terminal GND. The function of these circuit elements will be described later in detail with reference to FIG. 3 and following drawings.

In the first voltage detection circuit LVD1, the pair of resistors R11 and R12 divides a voltage across the associated battery cell BAT1 to generate a voltage division signal for input to the inverting input of the comparator 1. When the output voltage of the cell BAT1 is higher than the threshold voltage, the voltage division signal is higher than the reference voltage Vr1 supplied to the non-inverting input of the comparator 1. In such case, the comparator 1 outputs a low voltage signal to turn on the PMOS transistor M1. The second through fourth circuits LVD2 through LVD4 operate in a manner similar to the first circuit LVD1.

Thus, when the output voltages of the secondary battery cells BAT1 through BAT4 connected in series are all higher than the threshold voltage, the PMOS transistors M1 through M4 remain on to output high voltage signals to the low voltage detection terminals at their respective drains, which in turn cause the NMOS transistors M11 through M14 to remain on. As a result, the low voltage detection signal LVS remains at a low level, indicating that all the secondary battery cells BAT1 through BAT4 keep their output voltages above the threshold voltage.

Now, consider a case where the output voltage of the first cell BAT1 falls below the lower threshold voltage. When this occurs, the voltage division signal output by the pair of resistors R11 and R12 falls below the reference voltage so that the output of the comparator 1 goes high from low, which turns off the PMOS transistor M1. This causes the voltage at the drain of the PMOS transistor M1 (i.e., the low voltage detection terminal for the first cell BAT1) to go low, which turns off the NMOS transistor M11. As a result, the low voltage detection signal LVS goes from low to high, indicating that at least one of the secondary battery cells BAT1 through BAT4 has its output voltage falling below the lower threshold voltage.

Thus, the protection device 100 can indicate a low voltage condition through the detection signal LVS going high from low where at least one of the multiple battery cells BAT1 through BAT4 outputs a voltage lower than the threshold voltage.

Such low voltage detection takes place when any of the multiple battery cells BAT1 through BAT4 outputs a low voltage to cause the corresponding voltage detection circuit to output a low voltage signal to the low voltage detection terminal. The low voltage detection signal LVS is supplied to another circuit inside the protection device 100, which corrects the abnormal condition in a suitable manner in response to the low voltage detection.

In the protection circuit 100 shown in FIG. 1, each of the voltage detection comparators 1 through 4 is powered with a voltage across a specific one of the battery cells BAT1 through BAT4 associated with the voltage detection circuits LVD1 through LVD4, respectively.

Accordingly, when one of these comparators 1 through 4 detects a voltage falling below the lower threshold voltage across its associated battery cell, the same low voltage is supplied to power the comparator at the time of low voltage detection. This means that upon detecting low voltage of their respective associated battery cells BAT1 through BAT4, the multiple comparators 1 through 4 have a substantially identical level of power input, and hence exhibit a substantially identical input offset voltage. As a result, the voltage detector 10 can detect a low voltage condition with extremely high accuracy.

Figure 2:
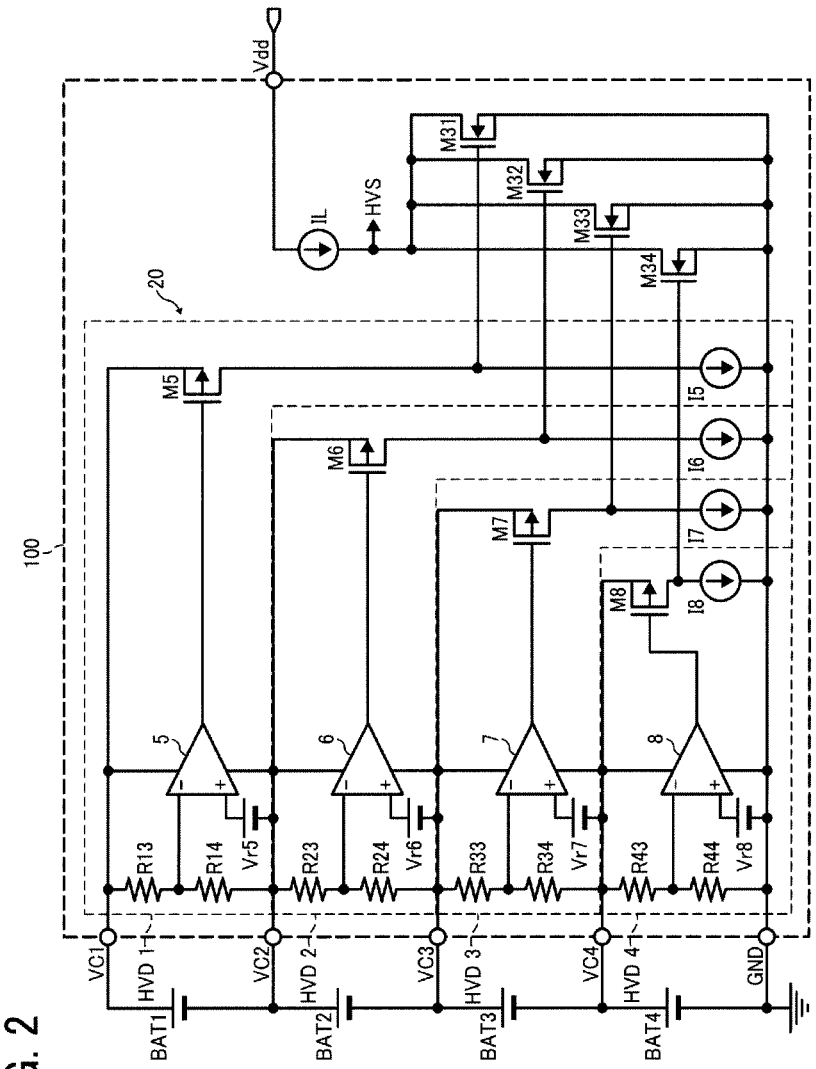
FIG. 2 is a circuit diagram illustrating the protection device of FIG. 1, shown with a high voltage detector for protecting a battery assembly against high voltages according to one embodiment of this patent specification.

FIG. 2 is a circuit diagram illustrating the protection device of FIG. 1 for protecting a battery assembly against high voltages according to one embodiment of this patent specification.

This embodiment represents an example in which the protection device 100 includes a high voltage detector 20 to detect a high voltage condition in the battery pack where at least one of the four cells BAT1 through BAT4 outputs a voltage higher than a given high threshold voltage. However, the number of battery cells included in the battery pack may be other than that depicted in the drawing, and the protection device 100 may also include a low voltage detector and an overcurrent detector, which are not depicted in the drawing.

As shown in FIG. 2, the protection device 100 includes battery terminals VC1 through VC4 for connection with the cells BAT1 through BAT4 of the secondary battery pack, a ground terminal GND, and a power supply terminal Vdd.

In the protection device 100, a positive electrode of the first cell BAT1 is connected to the battery terminal VC1, and a positive electrode of the second cell BAT2 and a negative electrode of the first battery cell BAT1 are connected together to the battery terminal VC2. A positive electrode of the third cell BAT3 and a negative electrode of the second cell BAT2 are connected together to the battery terminal VC3. A positive electrode of the fourth cell BAT4 and a negative electrode of the third cell BAT3 are connected together to the battery terminal VC4. A negative electrode of the fourth cell BAT4 is connected to the ground terminal GND. The power supply terminal Vdd is connected to a power supply, not shown, or to the battery terminal VC1.

The high voltage detector 20 includes comparators 5 through 8, reference voltage generators Vr5 through Vr8, a first pair of resistors R13 and R14, a second pair of resistors R23 and R24, a third pair of resistors R33 and R34, and a fourth pair of resistors R43 and R44, PMOS transistors M5 through M8, and constant current sources I5 through I8, as indicated by the area defined by broken lines in FIG. 2.

The configuration of the high voltage detector 20 is similar to that of the low voltage detector 10 depicted with reference to FIG. 1, except that the comparators 5 through 8 are configured to respond to an input voltage higher than that in the low voltage detector 1 by setting the reference voltages Vr5 through Vr8 higher than the reference voltages Vr1 through Vr4 and adjusting the ratio of voltage division through each voltage divide resistor pair.

In the high voltage detector 20, the comparator 5, the resistors R13 and R14, the reference voltage generator Vr5, the PMOS transistor M5, and the current source I5 together form a first detection circuit or sub-circuit HVT1 to detect a high voltage of the first battery cell BAT1. Similarly, the comparator 3, the resistors R23 and R24, the reference voltage generator Vr6, the PMOS transistor M6, and the current source I6 together form a second detection circuit HVD2 for the second cell BAT2, the comparator 7, the resistors R33 and R34, the reference voltage generator Vr7, the PMOS transistor M7, and the current source I7 together form a third detection circuit HVD3 for the third cell BAT3, and the comparator 8, the resistors R43 and R43, the reference voltage generator Vr8, the PMOS transistor M8, and the current source I8 together form a fourth detection circuit HVD4 for the fourth cell BAT4.

In the first detection circuit HVD1, the resistors R13 and R14 are connected in series between the battery connection terminals VC1 and VC2. The resistors R13 and R14 form a connection node therebetween coupled to an inverting input of the comparator 5. The reference voltage generator Vr5 is connected between a non-inverting input terminal of the comparator 5 and the battery connection terminal VC2.

Power terminals of the comparator 5 are connected to the battery connection terminals VC1 and VC2, respectively. An output terminal of the comparator 5 is connected to a gate of the PMOS transistor M5. A source of the PMOS transistor M5 is connected to the battery connection terminal VC1. The current source I5 is connected between a drain of the PMOS transistor M5 and the ground terminal GND. The drain of the PMOS transistor M5 constitutes a first high voltage detection terminal at which the first detection circuit HVD1 outputs a detection signal to indicate when detecting a voltage across the first battery cell BAT1 exceeds the higher threshold voltage.

The voltage detection circuits HVD1 through HVD4 contained in the low voltage detector 10 are substantially identical in configuration and operation, except for the battery cells to which the respective circuits are dedicated. Therefore, the configuration of the first detection circuit HVD1 described above suffices to explain the configuration of the other detection circuits HVD2 through HVD4, of which a further description is omitted for brevity.

The protection device 100 also includes first through fourth primary NMOS transistors M31 through M34. The NMOS transistors M31 through M34 have their source terminals connected together to the ground terminal GND, and drain terminals connected together to the power supply terminal Vdd through a current source or load IL.

A gate of the NMOS transistor M31 is connected to the drain of the PMOS transistor M5, which is the first high voltage detection terminal of the voltage detector 20. Similarly, a gate of the NMOS transistor M32 is connected to the drain of the PMOS transistor M6, a gate of the NMOS transistor M33 is connected to the drain of the PMOS transistor M7, and a gate of the NMOS transistor M34 is connected to the drain of the PMOS transistor M8.

A high voltage detection signal HVS is output from the connection where the respective NMOS transistors M31 through M34 connect to the current source IL for input to an internal circuit, not shown.

During operation, in the first voltage detection circuit HVD1, the pair of resistors R13 and R14 divides a voltage across the associated battery cell BAT1 to generate a voltage division signal for input to the inverting input of the comparator 5. When the output voltage of the cell BAT1 is lower than the threshold voltage, the voltage division signal is lower than the reference voltage Vr5 supplied to the non-inverting input of the comparator 5. In such case, the comparator 5 outputs a high voltage signal to turn off the PMOS transistor M5. The second through fourth circuits HVD2 through HVD4 operate in the manner similar to the first circuit HVD1.

Thus, when the output voltages of the secondary battery cells BAT1 through BAT4 connected in series are all lower than the threshold voltage, the PMOS transistors M5 through M8 remain off to output low voltage signals to the high voltage detection terminals at their respective drains, which in turn cause the NMOS transistors M31 through M34 to remain off. As a result, the high voltage detection signal HVS remains at a high level, indicating that all the secondary battery cells BAT1 through BAT4 keep their output voltages below the threshold voltage.

Now, consider a case where the output voltage of the first cell BAT1 exceeds the higher threshold voltage. When this occurs, the voltage division signal output by the pair of resistors R13 and R14 exceeds the reference voltage so that the output of the comparator 5 goes low from high, which turns on the PMOS transistor M5. This causes the voltage at the drain of the PMOS transistor M5 (i.e., the high voltage detection terminal for the first cell BAT1) to go high, which turns on the NMOS transistor M31. As a result, the high voltage detection signal HVS goes from high to low, indicating that at least one of the secondary battery cells BAT1 through BAT4 has its output voltage exceeding the higher threshold voltage.

Thus, the protection device 100 can indicate a high voltage condition through the detection signal HVS going low from high where at least one of the multiple battery cells BAT1 through BAT4 outputs a voltage higher than the threshold voltage.

Such high voltage detection takes place when any of the multiple battery cells BAT1 through BAT4 outputs a high voltage to cause the corresponding voltage detection circuit to output a high voltage signal to the high voltage detection terminal. The low voltage detection signal HVS is supplied to another circuit inside the protection device 100, which corrects the abnormal condition in a suitable manner in response to the high voltage detection.

In the protection circuit 100 shown in FIG. 2, each of the voltage detection comparators 5 through 8 is powered with a voltage across a specific one of the battery cells BAT1 through BAT4 associated with the voltage detection circuits HVD1 through HVD4, respectively.

Accordingly, as in the case for the low voltage detector 10, when one of these comparators 5 through 8 detects a voltage exceeding the higher threshold voltage across its associated battery cell, the same high voltage is supplied to power the comparator at the time of high voltage detection. This means that upon detecting high voltage of their respective associated battery cells BAT1 through BAT4, the multiple comparators 5 through 8 have a substantially identical level of power input, and hence exhibit a substantially identical input offset voltage. As a result, the voltage detector 20 can detect a high voltage condition with extremely high accuracy.

Figure 3:
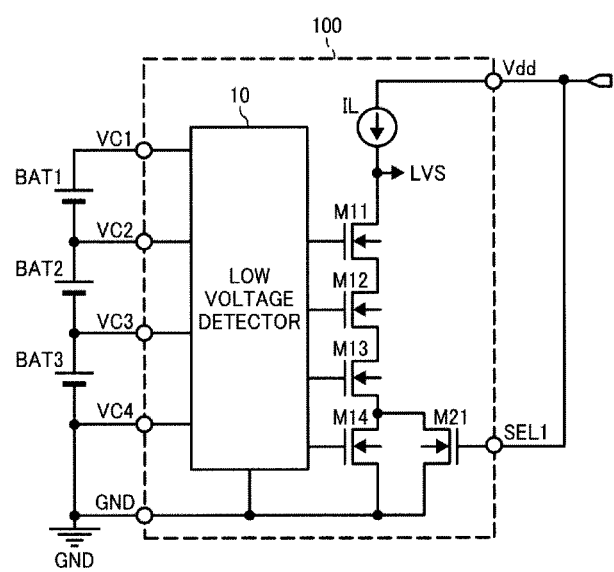
FIG. 3 is a circuit diagram illustrating the protection circuit with the low voltage detector in use with a series of three battery cells according to one embodiment of this patent specification.

FIG. 3 is a circuit diagram illustrating the protection circuit 100 with the low voltage detector 10 in use with a series of three battery cells BAT1 through BAT3 according to one embodiment of this patent specification.

The embodiment depicted in FIG. 3 represents an example where the low voltage detector 10 is reconfigured for use with the three-cell battery pack by connecting the selection terminal SEL1 to the power supply terminal Vdd instead of the ground terminal GND, with the battery terminal VC4 directly connected to the ground terminal GND.

During operation, the protection circuit 100 operates in a similar manner depicted with reference to FIG. 1, except that the fourth primary NMOS transistor M14 remains inactive and not involved in the low voltage detection, as the power supply voltage input through the selection terminal SEL1 causes the secondary NMOS transistor M21 to remain on.

Specifically, connecting the battery terminal VC4 to the ground terminal GND causes the NMOS transistor M14 to turn off. This turn-off of the NMOS transistor M14 does not cause the low voltage detection signal LVS to go high, however, since the secondary NMOS transistor M21 connected in parallel with the primary NMOS transistor M14 remains on. As a result, the low voltage detector 10 can perform low voltage detection for the three battery cells BAT1 through BAT3 connected to the battery terminals of the protection circuit 100.

Figure 4:
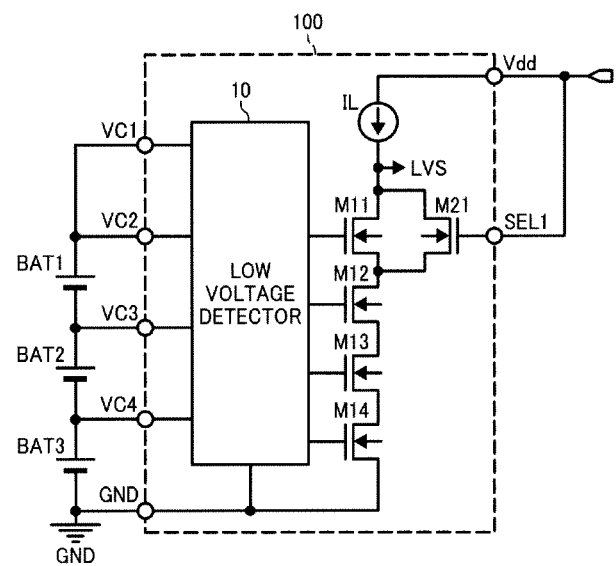
FIG. 4 is a circuit diagram illustrating the protection circuit with the low voltage detector in use with a series of three battery cells according to still another embodiment of this patent specification.

FIG. 4 is a circuit diagram illustrating the protection circuit 100 with the low voltage detector 10 in use with a series of three battery cells BAT1 through BAT3 according to still another embodiment of this patent specification.

The embodiment depicted in FIG. 4 is similar to that depicted in FIG. 3, except that the secondary NMOS transistor M21 is connected in parallel with the first primary NMOS transistor M11 instead of the fourth primary NMOS transistor M14, and the series of battery cells BAT1 through BAT3 are connected between the battery terminal VC2 and the ground terminal GND with the first and second battery terminals VC1 and V2 connected together to the positive electrode of the first battery cell BAT1.

During operation, the protection circuit 100 operates in a similar manner depicted with reference to FIG. 1, except that the first primary NMOS transistor M11 remains inactive and not involved in the low voltage detection, as the power supply voltage input through the selection terminal SEL1 causes the secondary NMOS transistor M21 to remain on.

Specifically, connecting the first battery terminal VC1 to the second battery terminal VC2 causes the NMOS transistor M11 to turn off. This turn-off of the NMOS transistor M11 does not cause the low voltage detection signal LVS to go high, however, since the secondary NMOS transistor M21 connected in parallel with the primary NMOS transistor M11 remains on. As a result, the low voltage detector 10 can perform low voltage detection for the three battery cells BAT1 through BAT3 connected to the battery terminals of the protection circuit 100.

Thus, according to this patent specification, the protection circuit 100 indicates low voltage condition of N battery cells connected in series by turning on and off the N primary MOS transistors connected in series. This protection circuit 100 can be reconfigured for use with (N−1) battery cells by switching the selection signal SEL1 applied to the gate of the secondary NMOS transistor connected in parallel with one of the primary NMOS transistors closest to the ground terminal or that closest to the power supply terminal Vdd.

Figure 5:
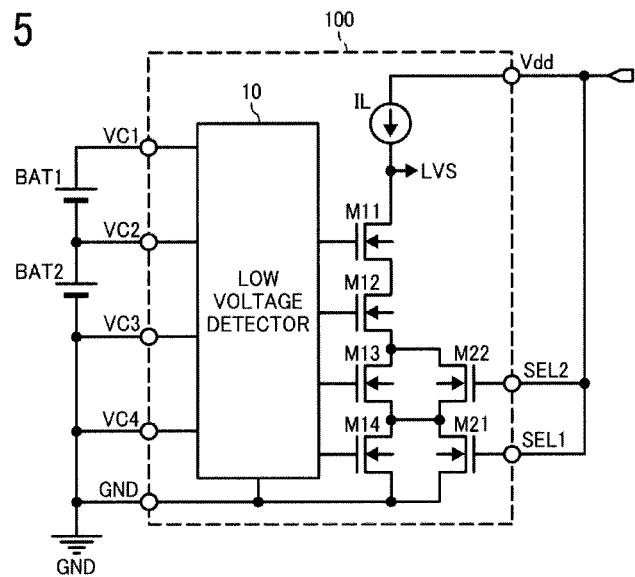
FIG. 5 is a circuit diagram illustrating the protection circuit with the low voltage detector in use with a series of two battery cells according to still another embodiment of this patent specification.

FIG. 5 is a circuit diagram illustrating the protection circuit 100 with the low voltage detector 10 in use with a series of two battery cells BAT1 and BAT2 according to still another embodiment of this patent specification.

The embodiment depicted in FIG. 5 is similar to that depicted in FIG. 3, except that the protection circuit 100 includes an additional secondary NMOS transistor M22 connected in parallel with the third primary NMOS transistor M13, as well as an additional selection terminal SEL2 connected to the gate terminal of the secondary NMOS transistor M22.

The selection terminals SEL1 and SEL2 and the secondary NMOS transistors M21 and M22 work in the manner as depicted above.

Thus, with the selection terminals SEL1 and SEL2 both connected to the power supply terminal Vdd as shown in the drawing, the low voltage detector 10 can perform low voltage detection for the two battery cells BAT1 and BAT2 connected to the battery terminals of the protection circuit 100. Further, the low voltage detector 10 can be reconfigured for use with a three-cell battery pack by connecting one selection terminal SEL1 to the power supply terminal Vdd and the other selection terminal SEL2 the ground terminal GND. Still further, the low voltage detector 10 can also be reconfigured for use with a four-cell battery pack by connecting both selection terminals SEL1 and SEL2 to the ground terminal GND.

Although in the embodiment depicted in FIG. 5, the secondary MOS transistors M21 and M22 are connected in parallel with the primary MOS transistors M14 and M13 closer to the ground terminal GND, alternatively, it is possible to provide secondary MOS transistors connected across the primary MOS transistors M11 and M12 closer to the power supply terminal Vdd. In such cases, the battery terminals not in use are connected together to a battery terminal to which the positive terminal of the first battery cell BAT1 is connected.

Figure 6:
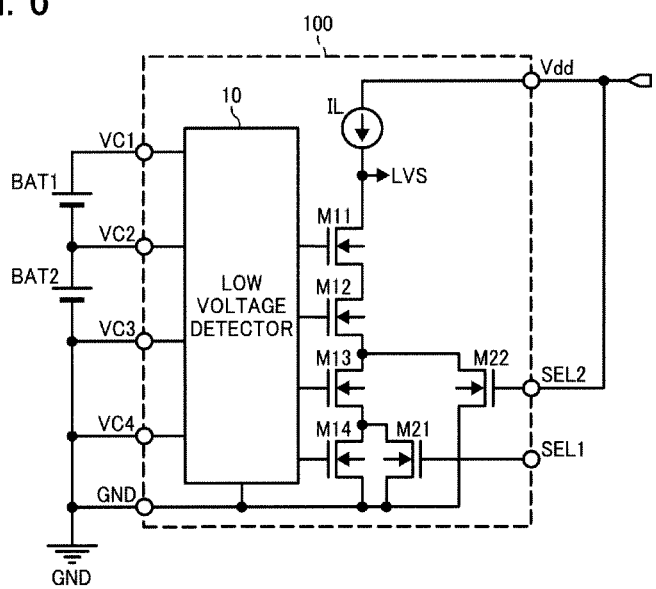
FIG. 6 is a circuit diagram illustrating the protection circuit with the low voltage detector in use with a series of two battery cells according to yet still another embodiment of this patent specification.

FIG. 6 is a circuit diagram illustrating the protection circuit 100 with the low voltage detector 10 in use with a series of two battery cells according to yet still another embodiment of this patent specification.

The embodiment depicted in FIG. 6 is similar to that depicted in FIG. 5, except that the additional secondary NMOS transistor M22 has its source terminal connected to the ground terminal GND instead of the drain terminal of the NMOS transistor M21, and the selection terminal SEL1 is not connected to the power supply terminal Vdd.

The selection terminals SEL1 and SEL2 and the secondary NMOS transistors M21 and M22 in this embodiment work in a manner similar to that depicted with reference to FIG. 5, except that the low voltage detector 10 can perform low voltage detection for the two battery cells BAT1 and BAT2 connected to the battery terminals of the protection circuit 100 with only the selection terminal SEL2 connected to the power supply terminal Vdd.

Although in the embodiment depicted in FIG. 6, the secondary MOS transistors M21 and M22 are connected across the primary MOS transistors M14 and M13 closer to the ground terminal GND, alternatively, it is possible to provide secondary MOS transistors connected across the primary MOS transistors M11 and M12 closer to the power supply terminal Vdd. In such cases, the battery terminals not in use are connected together to a battery terminal to which the positive terminal of the first battery cell BAT1 is connected.

Although in the several embodiments depicted above, the secondary MOS transistor(s) is connected in parallel with the primary MOS transistor closest to the ground terminal GND or to the power supply terminal Vdd, it is also possible to provide the secondary MOS transistor connected in a manner different from those described in those embodiments. That is, the protection device 100 according to this patent specification, which indicates a low voltage condition of N battery cells connected in series by turning on and off the primary MOS transistors, may use (N-1) or fewer secondary MOS transistors each connected in parallel with one or more of the primary MOS transistors at any location relative to the ground and power supply terminals.

The protection device 100 according to this patent specification may be implemented in a battery pack containing multiple secondary cells for installation in various electronic devices, such as laptop personal computers or note PCs, mobile phones, video cameras, digital cameras, portable receivers compatible with One-Seg broadcasting, portable music players, and personal digital assistants (PDAs).

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-064319 filed on Mar. 17, 2009 in the Japanese Patent Office, the entire contents of which are incorporated by reference herein.

What is claimed is:

1. A protection device for use in a battery assembly containing a series of N secondary battery cells, "N" being a positive integer greater than one, the protection device comprising:
   a voltage detector having N or more sub-circuits each for monitoring a specific battery cell to output a detection signal when at least one of the battery cells outputs an abnormal voltage,
   each sub-circuit including:
      voltage dividing resistors to generate a voltage division signal by dividing an output voltage of the battery cell;
      a reference voltage generator to generate a reference voltage; and
      a comparator to compare the voltage division signal against the reference voltage,
      each comparator being powered with voltage across the battery cell associated with the sub-circuit;
   a selection terminal to output a selection signal specifying a number of battery cells connected to the protection device in the battery assembly;
   a load connected between a power supply terminal and a ground terminal of the protection circuit;
   N primary metal-oxide-semiconductor transistors connected in series with the load between the power supply terminal and the ground terminal, each to turn off in response to the detection signal output from the low voltage detector; and
   (N-1) or fewer secondary metal-oxide-semiconductor transistors each connected in parallel with one or more of the primary transistors and having a gate terminal connected to the selection terminal to deactivate and activate the one or more primary transistors by turning on and off in response to the selection signal,
   the protection circuit outputting a voltage detection signal other circuit at a node where the load connects to the series of primary transistors.

2. The protection device according to claim 1, wherein the voltage detector outputs a detection signal when at least one of the battery cells outputs a voltage falling below a given lower threshold voltage.

3. The protection device according to claim 1, wherein the voltage detector outputs a detection signal when at least one of the battery cells outputs a voltage exceeding a given higher threshold voltage.

4. A battery pack that includes the protection device of claim 1.

5. An electronic device that employs the protection device of claim 1.

6. A protection device for use in a battery assembly containing a series of N secondary battery cells, "N" being a positive integer greater than one, the protection device comprising:
   a voltage detector to output a detection signal when at least one of the battery cells outputs an abnormal voltage;
   a selection terminal to output a selection signal specifying a number of battery cells connected to the protection device in the battery assembly;
   a load connected between a power supply terminal and a ground terminal of the protection circuit;
   N primary metal-oxide-semiconductor transistors connected in series with the load between the power supply terminal and the ground terminal, each to turn off in response to the detection signal output from the low voltage detector; and
   (N-1) or fewer secondary metal-oxide-semiconductor transistors each connected in parallel with one or more of the primary transistors and having a gate terminal connected to the selection terminal to deactivate and activate the one or more primary transistors by turning on and off in response to the selection signal,
   the protection circuit outputting a voltage detection signal to another circuit at a node where the load connects to the series of primary transistors.

7. The protection device according to claim 6, wherein the voltage detector outputs the detection signal when at least one of the battery cells outputs a voltage falling below a given lower threshold voltage.

8. The protection device according to claim 6, wherein the voltage detector outputs the detection signal when at least one of the battery cells outputs a voltage exceeding a given higher threshold voltage.

9. The protection device according to claim 6,
wherein the protection device includes M selection terminals and a series of M secondary transistors, "M" being a positive integer greater than one and not exceeding (N−1),
each secondary transistors being connected in parallel with an associated one of M primary transistors closer to either one of the ground terminal or the power supply terminal.

10. The protection device according to claim 9,
wherein the protection device includes M selection terminals and M secondary transistors, "M" being a positive integer greater than one and not exceeding (N−1),
an m-th of the secondary transistors being connected in parallel with m primary transistors closer to either one of the ground terminal or the power supply terminal, "m" being a positive integer equal to or smaller than M.

11. A battery pack that includes the protection device of claim 6.

12. An electronic device that employs the protection device of claim 6.

* * * * *